United States Patent
Mahant-Shetti et al.

[11] Patent Number: 5,926,039
[45] Date of Patent: Jul. 20, 1999

[54] ACTIVE LOAD FOR AN N CHANNEL LOGIC NETWORK

[75] Inventors: Shivaling S. Mahant-Shetti, Richardson, Tex.; Kameshwar C. Rao, Bangalore, India

[73] Assignee: Texas Instruments Incorporated, Dallas, Tex.

[21] Appl. No.: 08/820,728

[22] Filed: Mar. 19, 1997

[51] Int. Cl.⁶ .................. H03K 19/096; H03K 19/017
[52] U.S. Cl. .................. 326/98; 326/17; 326/45
[58] Field of Search .................. 326/93, 95, 98, 326/17, 39, 44–45, 49–50; 327/374–375

[56] References Cited

U.S. PATENT DOCUMENTS

| | | | |
|---|---|---|---|
| 4,782,249 | 11/1988 | Engeler et al. | 326/45 |
| 5,121,005 | 6/1992 | Parker | 326/44 |
| 5,619,153 | 4/1997 | Shenoy et al. | 327/374 |
| 5,670,898 | 9/1997 | Fang | 326/93 |

*Primary Examiner*—Jon Santamauro
*Attorney, Agent, or Firm*—Jacqueline J. Garner; W. James Brady, III; Richard L. Donaldson

[57] ABSTRACT

An active load (12) is provided for an N channel logic network (10). The active load (12) includes a P channel device (28) coupled to the output node (14) of the N channel network (10). A clock circuit (16) of the active load (12) determines whether the N channel network (10) is in a steady state or a switching mode. If the N channel network (10) is in a switching mode, an intermediate voltage level, $V_{bias}$, is applied at the gate of the P channel device (28) to facilitate fast switching at the output node (14) with low quiescent power consumption and without compromising compact semiconductor layout.

12 Claims, 1 Drawing Sheet

5,926,039

ACTIVE LOAD FOR AN N CHANNEL LOGIC NETWORK

TECHNICAL FIELD OF THE INVENTION

This invention relates in general to the field of electronic circuits and more particularly to an improved active load for an N channel logic network.

BACKGROUND OF THE INVENTION

The poor performance characteristics of P channel (PMOS) field effect transistors (FETs) in digital logic applications as compared to N channel (NMOS) FETs is in part due to the mobilities of the respective carriers of the P channel and N channel devices. The carriers of P channel devices are holes, which have a lower mobility than do the electron carriers of N channel devices. P channel devices hence have a higher $R_{on}$ value than do N channel devices for similar device sizes, indicating that P channel devices have a higher internal resistance during the ON state than do N channel devices. N channel devices also have a narrower channel and take up less space on a semiconductor wafer than do P channel devices. For these reasons, N channel devices are preferred over P channel devices for digital logic applications.

CMOS logic, which is characterized by a logic element formed by the combination of one or more NMOS transistors and one or more complementary PMOS transistors, is preferred for digital applications requiring low power consumption and fast switching between logic states. A logic circuit using only PMOS or only NMOS transistors without its NMOS or PMOS complements, respectively, may draw excessive current in the ON state. CMOS logic devices, in contrast, draw no quiescent current. Also, a logic circuit having only PMOS or NMOS logic may have a high output impedance in the OFF state, a condition which may reduce transistor switching speed. CMOS logic has characteristically low output impedance.

CMOS devices, however, may suffer from high power dissipation at high switching frequencies. The power consumed by a CMOS logic gate increases with increasing switching speed, rendering CMOS logic applications unattractive at high switching speeds. In addition, in a logic circuit having a large number of CMOS gates, each CMOS gate must drive the immediately succeeding gates and therefore encounters the capacitive loading of the succeeding gates. In addition, because a PMOS device has a wider channel and is larger than its N channel complement, the capacitive loading experienced by each CMOS gate is exacerbated by the presence of the PMOS transistor complement of each CMOS logic gate. Therefore, for circuits having high switching speeds, CMOS circuits may not be preferable.

In applications such as busses with several drivers, implementing full CMOS would require considerable wiring resources. The circuit described here would be advantageous in such a case.

SUMMARY OF THE INVENTION

Therefore, a need has arisen for an active load for an N channel logic network that is able to provide reduced power consumption at high switching speeds without compromising the compactness of transistor layout on a semiconductor wafer. The active load of the present invention includes a P channel device coupled to the output node of the N channel network. A clock circuit of the active load determines whether the N channel network is in a steady state or a switching mode. If the N channel network is in a switching mode, an intermediate voltage level, $V_{bias}$, is applied to the gate of the P channel device to facilitate fast switching at the output node. In the case of programmable logic arrays (PLAs), the active load of the present invention may be applied as an active load for each row or column of logic elements in the PLA.

The technical advantages of the present invention include an active load able to act as the P channel complement of the N channel network in order to improve the switching speed of the N channel network and reduce power consumption at high switching speeds. Another technical advantage of the active load of the present invention is the compact wafer layout of the active load. Still another technical advantage of the present invention is the reduced capacitive loading experienced in the N channel network as compared to that seen by the logic gates in a conventional CMOS logic network.

BRIEF DESCRIPTION OF THE DRAWINGS

A more complete understanding of the present invention and the advantages associated therewith may be acquired by referring to the accompanying drawings in which like reference numbers indicate like features and wherein.

DETAILED DESCRIPTION OF THE INVENTION

Figure 1:
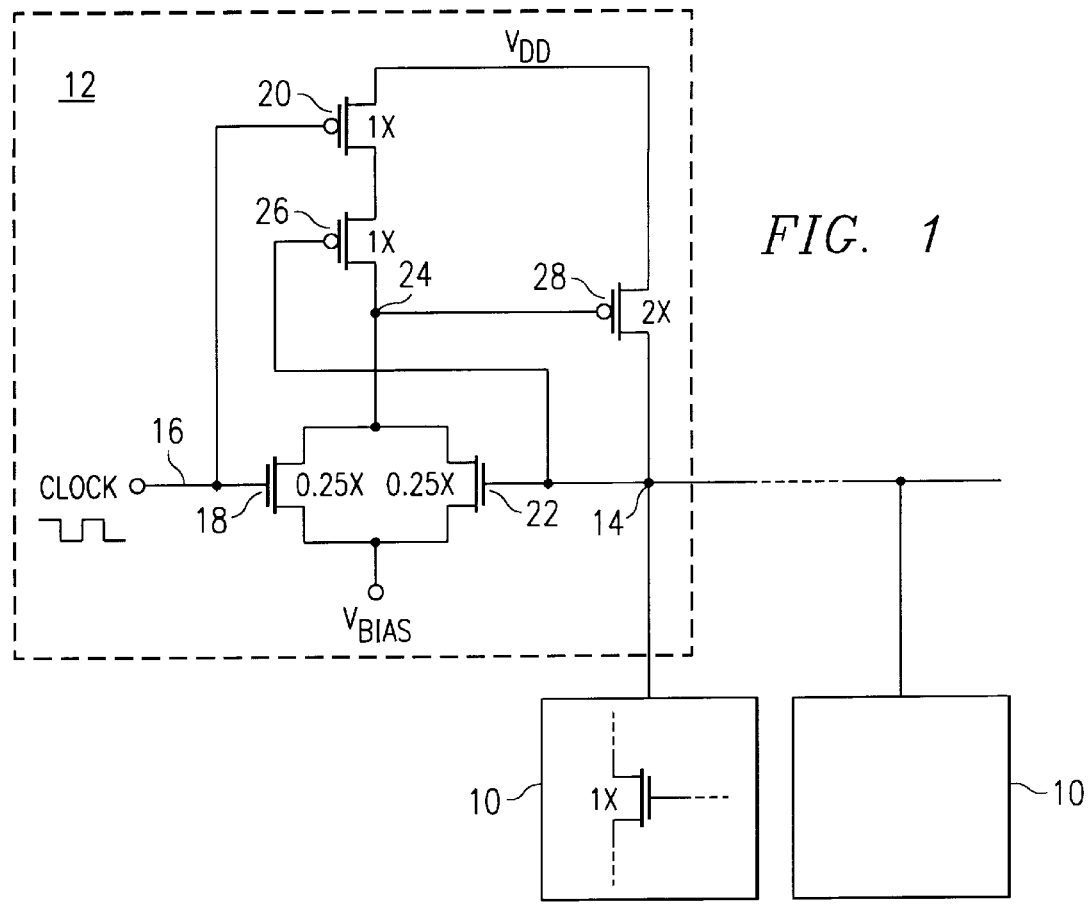
FIG. 1 is a circuit diagram of the active load of the present invention.

As shown in FIG. 1, an N channel network 10 having a plurality of N channel logic gates is connected to an active load 12. N channel network 10 may comprise a plurality of NMOS logic elements forming, for example, a plurality of NOR gates. Connected between N channel network 10 and active load 12 is an output node 14. Output node 14 serves as both an output port for N channel network 10 and an input port for active load 12.

Active load 12 includes a clock circuit 16, the output of which is connected to the gate of an NMOS transistor 18 and the gate of a PMOS transistor 20. The drain and source of NMOS transistor 18 are coupled, respectively, to the drain and source of an NMOS transistor 22. Coupled to the sources of each of NMOS transistors 18 and 22 is a bias voltage, $V_{bias}$. The interconnection of the drains of NMOS transistors 18 and 22 forms an output bias voltage node 24. The gate of NMOS transistor 22 is coupled to output node 14. In the embodiment of the present invention shown in FIG. 1, active load 12 does not have a grounded connection.

The drain of PMOS transistor 20 is coupled to a supply voltage, $V_{DD}$. The source of PMOS transistor 20 is coupled to the drain of PMOS transistor 26, whose source is coupled to the output bias voltage node 24. The gate of PMOS transistor 26 is coupled to output node 14. A PMOS transistor 28 has a drain coupled to voltage $V_{DD}$ and a source coupled to output node 14. The gate of PMOS transistor 28 is coupled to output voltage bias node 24.

As shown in FIG. 1 and described above, the logical voltage level at output node 14 is applied at the gate of NMOS transistor 22 and PMOS transistor 26. Output node 14 serves as both the output of N channel network 10 and as an input source for active load 12. The relative sizes of the NMOS transistors and PMOS transistors of active load 12 and N channel network 10 are indicated in FIG. 1 as multipliers of size constant "X."

Clock circuit 16 switches between a logical high and a logical low. When clock circuit 16 is at a logical high, indicating that N channel network 10 is in a switching state, PMOS transistor 20 is nonconductive, NMOS transistor 18 is conductive, and $V_{bias}$ is applied at output bias voltage node 24. $V_{bias}$ is a global voltage value and is set at an intermediate voltage in the range between $V_{DD}$ and zero volts. In one embodiment of the present invention, $V_{bias}$ is set at $V_{DD}/2$. In other embodiments, $V_{bias}$ may be set at or near zero volts.

As the P channel complement of N channel network 10, active load 12 acts as a smart pull-up circuit to assist in the switching of output node 14 from a logical high to a logical low. The gate of the PMOS transistor must be at a logical low if the output of the gate is to be high. Conversely, for the logic gate to be at a logical low, the gate of the PMOS transistor must be at a logical high. A high to low transition of the output node of a CMOS logic gate cannot begin until the voltage of the gate of the PMOS transistor has risen sufficiently to turn off the PMOS transistor.

In the active load 12 of FIG. 1, as discussed above, when clock circuit 16 is at a logical high, the voltage at output bias voltage node 24 is approximately equal to $V_{bias}$. If clock circuit 16 is at a logical low and the voltage of output node 14 is low, PMOS transistors 20 and 26 are driven into conduction, NMOS transistors 18 and 22 are rendered nonconductive, and $V_{DD}$ is applied through PMOS transistors 20 and 26 to the gate of PMOS transistor 28, rendering PMOS transistor 28 nonconductive. If the clock circuit 16 is at a logical low and the voltage of output node 14 is at a logical high, PMOS transistor 26 is rendered nonconductive, blocking $V_{DD}$, NMOS transistor 22 is rendered conductive, and the voltage $V_{bias}$ is applied at the gate of PMOS transistor 28. PMOS transistor 28 acts as an output transistor or output gate of active load 12.

Thus, during the steady state condition when there is no switching in N channel network 10, a state dependent voltage is applied to the gate of PMOS transistor 28, reducing the DC power applied to active load 12. This state dependent voltage is $V_{DD}$ in the case of a logical low at output node 14 and $V_{bias}$ in the case of a logical high at output node 14. Because of the switching of the PMOS and NMOS transistors of active load 12, whenever clock circuit 16 is at a logical low, the voltage at output node 14 is able to reach its full supply level $V_{DD}$.

During switching of the output voltage at output node 14, clock circuit 14 is at a logical high, thereby placing output bias voltage node 24 at $V_{bias}$. The application of $V_{bias}$ at the gate of PMOS transistor 28 speeds the rise of the voltage level at the gate of PMOS transistor 28 to further speed the transition from a logical high to a logical low at output node 14. Placing output bias voltage node 24 at $V_{bias}$ allows some power consumption in active load 12, but provides a significant voltage level at output voltage bias node 12 to speed the transition between high and low states at output node 14. Thus, high switching speeds are accomplished with the active load circuit of the present invention without causing excessive power consumption at high switching speeds. In addition, because active load 12 in the embodiment of the present invention employs only three PMOS transistors, active load 12 does not compromise the compact layout of an NMOS logic network. Further, because active load 12 does not have a large number of PMOS transistors, as would be necessary in a CMOS logic application, the capacitive loading of the NMOS transistors of the N channel network 10 is reduced and writing necessary to connect the full CMOS logic is also not required.

Figure 2:
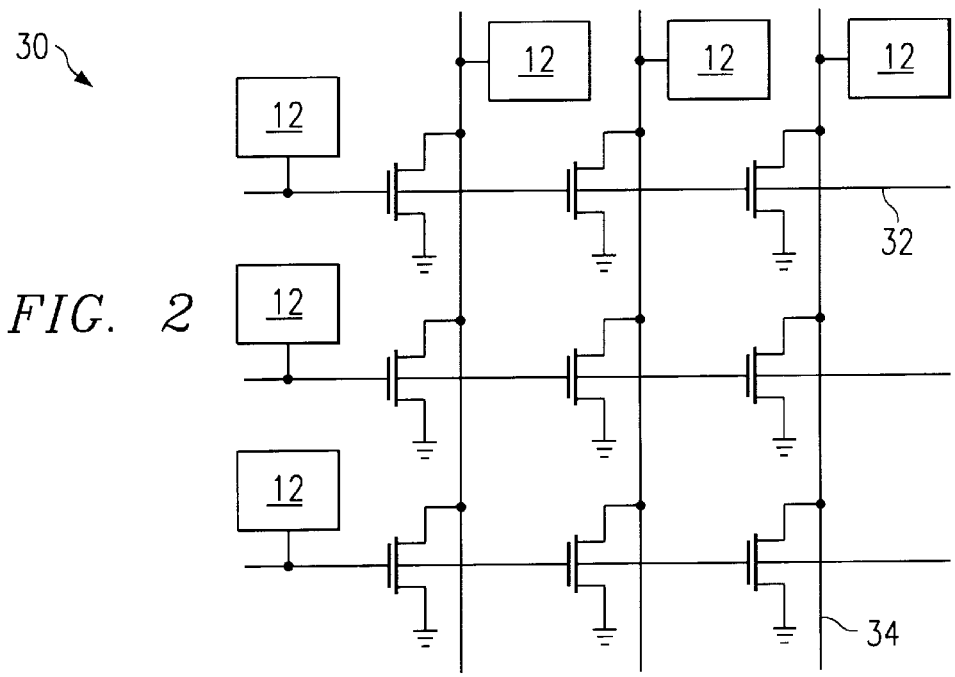
FIG. 2 is a circuit diagram of the active load of the present invention implemented on a programmable logic array.

The active load of the present invention can also be applied as an active load for N channel programmable logic array (PLA). A PLA includes a plurality of logic gates with programmable interconnections. As shown in FIG. 2, each PLA, indicated generally at 30, comprises a series of rows 32 and columns 34 of logic elements, such as N channel devices. The N channel devices of rows 32 and columns 34 are configurable to provide a desired logic application. In order to reduce quiescent power consumption and improve switching speed, each logical row 32 or logical column 34 is coupled to an active load 12 described with reference to FIG. 1. The application of active loads 12 to each row 32 or column 34 of N channel devices provides a P channel complement that aids switching speed without compromising power consumption or the layout of the N channel transistors on the semiconductor wafer.

Although the present invention has been described in detail, it should be understood that various changes, alterations, and substitutions may be made to the teachings herein without departing from the spirit and scope of the present invention, which is defined solely by the appended claims.

What is claimed is:

1. A circuit comprising,
   an N channel logic network having an output coupled to an output node; and
   an active load comprising a P channel device coupled to said output node and operably driven by one of two voltage levels, the lower voltage level with a value greater than zero volts and no greater than the higher voltage level of the active load wherein the lower voltage level is sufficient to drive the P channel device partially into conduction to facilitate logical switching at the output node.

2. The circuit of claim 1, wherein the P channel device comprises a PMOS transistor.

3. The circuit of claim 1,
   wherein the P channel device comprises a PMOS transistor having a source coupled to the output node, a gate, and a drain;
   a supply voltage coupled to the drain of the PMOS transistor;
   wherein the higher of the two voltage levels is equal to the supply voltage and is sufficient to turn the PMOS transistor OFF upon the application of the supply voltage to the gate of the PMOS transistor; and
   wherein the lower voltage level is greater than zero volts and no greater than the supply voltage.

4. The circuit of claim 1, wherein the active load further comprises a clock circuit operable to determine whether the output node is in a steady state mode or in a switching mode such that the lower voltage level is applied to the P channel device when the output node is in a switching mode.

5. The circuit of claim 1, wherein the active load further comprises a clock circuit operable to determine whether the output node is in a steady state mode or in a switching mode such that either the higher voltage level or the lower voltage level is applied to the P channel device when the output node is in a switching mode.

6. The circuit of claim 1, wherein the active load further comprises,
   a supply voltage coupled to the P channel device;
   an NMOS transistor coupled between the lower voltage level and the P channel device to provide a path for the application of the lower voltage level to the P channel device upon the application of a logical high voltage to the NMOS transistor and to block the application of the lower voltage level to the P channel device upon the application of a logical low voltage to the NMOS transistor;

a PMOS transistor coupled between the supply voltage and the P channel device to block the application of the supply voltage to the P channel device upon the application of a logical high voltage to the PMOS transistor and to provide a path for the application of the supply voltage to the P channel device upon the application of a logical low voltage to the PMOS transistor; and a clock circuit operable to provide a logical high voltage level and a logical low voltage level and coupled to the NMOS transistor and the PMOS transistor.

7. The circuit of claim 1, wherein the active load further comprises, a supply voltage coupled to the P channel device;

an NMOS transistor having a gate coupled to the output node and coupled between the lower voltage level and the P channel device to provide a path for the application of the lower voltage level to the P channel device upon the application of a logical high voltage to the gate of the NMOS transistor from the output node and to block the application of the lower voltage level to the P channel device upon the application of a logical low voltage to the gate of the NMOS transistor from the output node; and a PMOS transistor having a gate coupled to the output node and coupled between the supply voltage and the P channel device to block the application of the supply voltage to the P channel device upon the application of a logical high voltage to the PMOS transistor and to provide a path for the application of the supply voltage to the P channel device upon the application of a logical low voltage to the gate of the PMOS transistor from the output node.

8. The circuit of claim 1, wherein the active load further comprises, a supply voltage coupled to the P channel device;

a clock circuit operable to provide a logical high voltage level and a logical low voltage level;

a first PMOS transistor having a gate coupled to the clock circuit and coupled between the supply voltage and the P channel device to block the application of the supply voltage to the P channel device upon the application of a logical high voltage to the first PMOS transistor and to provide a path for the application of the supply voltage to the P channel device upon the application of a logical low voltage to the first PMOS transistor;

a second PMOS transistor having a gate coupled to the output node and coupled between the supply voltage and the P channel device to block the application of the supply voltage to the P channel device upon the application of a logical high voltage to the second PMOS transistor and to provide a path for the application of the supply voltage to the P channel device upon the application of a logical low voltage to the gate of the second PMOS transistor;

a first NMOS transistor having a gate coupled to the clock circuit and coupled between the lower voltage level and the P channel device to provide a path for the application of the lower voltage level to the P channel device upon the application of a logical high voltage to the first NMOS transistor and to block the application of the lower voltage level to the P channel device upon the application of a logical low voltage to the first NMOS transistor; and a second NMOS transistor having a gate coupled to the output node and coupled between the lower voltage level and the P channel device to provide a path for the application of the lower voltage level to the P channel device upon the application of a logical high voltage to the gate of the NMOS transistor from the output node and to block the application of the lower voltage level to the P channel device upon the application of a logical low voltage to the NMOS transistor.

9. A method for switching an active load of an N channel logic network, comprising the steps of:

applying the output of the N channel network to the active load;

providing a clocked input signal to the active load;

applying an intermediate bias voltage to the output gate of the active load if the clocked input signal is at a logical high;

applying the intermediate bias voltage to the output gate of the active load if the clocked input is at a logical low and the output of the N channel network is at a logical high;

applying a supply voltage to the output gate of the active load if the clocked input is at a logical low and the output of the N channel network is at a logical low;

monitoring the clocked input signal and the output of the N channel network to apply either the intermediate bias voltage or the supply voltage in response to changes in the clocked input signal or the output of the N channel network; and wherein the intermediate bias voltage is greater than zero volts and no greater than the supply voltage.

10. The method for switching an active load of a N channel logic network of claim 9, wherein the output gate of the active load is a PMOS transistor.

11. A programmable logic array, comprising:

a plurality of logic elements substantially arranged in rows and columns representing a logical row or a logical column, respectively, each of the logical rows or logical columns having an output node;

an active load coupled to each of the output nodes, the active load comprising, a PMOS transistor coupled to said output node and operably driven by one of two voltage levels, the lower voltage level at voltage level sufficient to drive the PMOS transistor partially into conduction to facilitate logical switching at the output node and the higher voltage level at a voltage level sufficient to drive the PMOS transistor into the OFF state, the application of the lower voltage level or the higher voltage level being determined by (1) the logical level of a clock circuit electrically coupled to the PMOS transistor and (2) the logical level of the output node; and wherein the lower voltage level of the active load is greater than zero volts and no greater than the higher voltage level.

12. The programmable logic array of claim 11, wherein the active load further comprises a supply voltage coupled to the PMOS transistor;

wherein the higher voltage level is equal to the supply voltage; and wherein the lower voltage level of the active load is greater than zero volts and no greater than the higher voltage level.

* * * * *

UNITED STATES PATENT AND TRADEMARK OFFICE
CERTIFICATE OF CORRECTION

PATENT NO. : 5,926,039
DATED : July 20, 1999
INVENTOR(S) : Shivaling S. Mahant-Shetti et al.

It is certified that error appears in the above-identified patent and that said Letters Patent is hereby corrected as shown below:

On the title page, insert the following: Item [60]  --Provisional application number 60/013,895, filed March 22, 1996 --

Column 1, line 3, insert the following:  --Cross Reference to related application, reference is made to and priority claimed from US provisional application serial no. 60/013,895 filed March 22, 1996 --.

Signed and Sealed this

Second Day of May, 2000

Attest:

Q. TODD DICKINSON

*Attesting Officer*  *Director of Patents and Trademarks*